(12) United States Patent
Saito et al.

(10) Patent No.: US 7,427,439 B2
(45) Date of Patent: Sep. 23, 2008

(54) AMORPHOUS-CARBON COATED MEMBER

(75) Inventors: Toshiyuki Saito, Toyoake (JP); Junji Ando, Kariya (JP); Kazuyuki Nakanishi, Seto (JP); Hiroyuki Mori, Nisshin (JP); Hideo Tachikawa, Nisshin (JP)

(73) Assignee: JTEKT Corporation, Osaka-shi (JP)

( * ) Notice: Subject to any disclaimer, the term of this patent is extended or adjusted under 35 U.S.C. 154(b) by 372 days.

(21) Appl. No.: 11/369,861

(22) Filed: Mar. 8, 2006

(65) Prior Publication Data

US 2006/0210833 A1    Sep. 21, 2006

(30) Foreign Application Priority Data

Mar. 15, 2005    (JP)    ............................. 2005-074126

(51) Int. Cl.
    *B32B 9/00*    (2006.01)
(52) U.S. Cl. ...................................... 428/408; 428/336
(58) Field of Classification Search ................ 428/336, 428/408, 446
    See application file for complete search history.

(56) References Cited

U.S. PATENT DOCUMENTS 5,541,003 A * 7/1996 Nakayama et al. .......... 428/408
5,942,317 A * 8/1999 White ........................ 428/336
6,335,086 B1 * 1/2002 Veerasamy .................. 428/446

FOREIGN PATENT DOCUMENTS

JP    6-101047    * 4/1994

OTHER PUBLICATIONS

U.S. Appl. No. 11/369,861, filed Mar. 8, 2006, Saito et al.
U.S. Appl. No. 10/544,674, filed Aug. 4, 2005, Ando et al.

* cited by examiner

*Primary Examiner*—Archene Turner
(74) *Attorney, Agent, or Firm*—Oblon, Spivak, McClelland, Maier & Neustadt, P.C.

(57) ABSTRACT

An amorphous-carbon coated member includes a conductive substrate, and an amorphous carbon film. The amorphous carbon film is fixed onto a part of a surface of the substrate at least, and includes a compositionally gradient film. The compositionally gradient film has an outer side and a substrate side, and is composed of carbon, silicon and hydrogen. The silicon concentration inclines continuously from the lowest to the highest in the direction away from the outer side to the substrate side. The hydrogen concentration inclines continuously from the highest to the lowest in the direction away from the outer side to the substrate side. The amorphous-carbon coated member exhibits not only good wear resistance but also low aggressiveness against mating member simultaneously.

11 Claims, 2 Drawing Sheets

AMORPHOUS-CARBON COATED MEMBER

INCORPORATION BY REFERENCE

This invention is based on and claims priority under 35 U.S.C. 119 with respect to Japanese Patent Application No. 2005-074126, filed on Mar. 15, 2005, the entire contents of which are incorporated herein by reference.

BACKGROUND OF THE INVENTION

1. Field of the Invention

The present invention relates to a coated member on which a coating film is formed on a surface of substrate in order to give it characteristics, such as wear resistance. In particular, it relates to an amorphous-carbon coated member whose coating film comprises an amorphous carbon film.

2. Description of the Related Art

Carbon is an extremely good material in view of resource issues and environmental issues, because its deposits are substantially infinite and it is harmless. As for carbon materials, many materials having various crystalline structures, such as diamonds, diamond-like carbon, graphite, fullerenes, carbon nano-tubes, have been known depending on the bonding forms between atoms. Among them, diamond-like carbon (or amorphous carbon) having an amorphous structure is an attractive functional material which is good in terms of mechanical characteristics, such as wear resistance and solid lubricating property, and which has insulative property, visible/infrared light transmissivity, low dielectric constant, oxygen barrier property, and the like. The amorphous carbon is expected to be applicable to many industrial fields.

Amorphous carbons having various compositions have been studied so far in order to improve the characteristics of amorphous carbon. For example, Japanese Unexamined Patent Publication (KOKAI) No. 6-101,047 discloses an amorphous carbon film whose major component is carbon and which contains silicon in an amount of 30 atomic % or less. The amorphous carbon film disclosed in the patent publication is a hard film which exhibits a high hardness, a Vickers hardness of 4,500 Hv or more, and shows good wear resistance.

However, when a hard film of good wear resistance is used for the sliding surface of various apparatuses, the hard film tends to exhibit higher aggressiveness against the mating member. Accordingly, there arises a problem that the hard film has worn off the mating member eventually.

SUMMARY OF THE INVENTION

The present invention has been developed in view of the aforementioned problem. It is therefore an object of the present invention to provide an amorphous-carbon coated member which exhibits good wear resistance as well as low aggressiveness against mating member simultaneously.

An amorphous-carbon coated member according to the present invention comprises a conductive substrate, and an amorphous carbon film fixed onto a part of a surface of the substrate at least. Moreover, the amorphous carbon film comprises a compositionally gradient film. In addition, the compositionally gradient film has an outer side and a substrate side, and is composed of carbon as a major component, silicon whose concentration inclines continuously from the lowest to the highest in the direction away from the outer side to the substrate side, and hydrogen whose concentration inclines continuously from the highest to the lowest in the direction away from the outer side to the substrate side.

Here, as an example of an amorphous-carbon coated member according to the present invention, FIG. 4 illustrates the cross-sectional diagram of the present amorphous-carbon coated member, and the elemental-concentration distributions of silicon and hydrogen therein. "Inclining continuously" herein specifies that the concentration of silicon changes little by little from the lowest concentration to the highest concentration continuously in the direction away from the outer side of the amorphous carbon film to the substrate side thereof; and the concentration of hydrogen changes little by little from the highest concentration to the lowest concentration continuously in the direction away from the outer side of the amorphous carbon film to the substrate side thereof. Therefore, the amorphous carbon film of the present amorphous-carbon coated member does not involve films whose composition changes stepwise (or discontinuously), such as films in which a plurality of layers whose composition differs to each other, for example.

The present amorphous-carbon coated member comprises the amorphous carbon film comprising the compositionally gradient film in which the silicon concentration inclines gradually so that the silicon concentration is the highest on the substrate side. Accordingly, the amorphous carbon film exhibits the highest hardness on the substrate side so that the substrate side can secure the strength of the amorphous carbon film. Moreover, in the present amorphous-carbon coated member, the amorphous carbon film is good in terms of the adhesion to the conductive substrate, because it has the highest silicon concentration at the interface between itself and the substrate.

Additionally, the amorphous carbon film comprises the compositionally gradient film in which the hydrogen concentration inclines gradually so that the hydrogen concentration is the lowest on the substrate side. Consequently, the amorphous carbon film exhibits the lowest hardness on the outer side so that the aggressiveness against mating member is reduced.

Specifically, the present amorphous-carbon coated member makes an amorphous-carbon coating film which exhibits high wear resistance as well as low aggressiveness against the mating member simultaneously.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Figure 1:
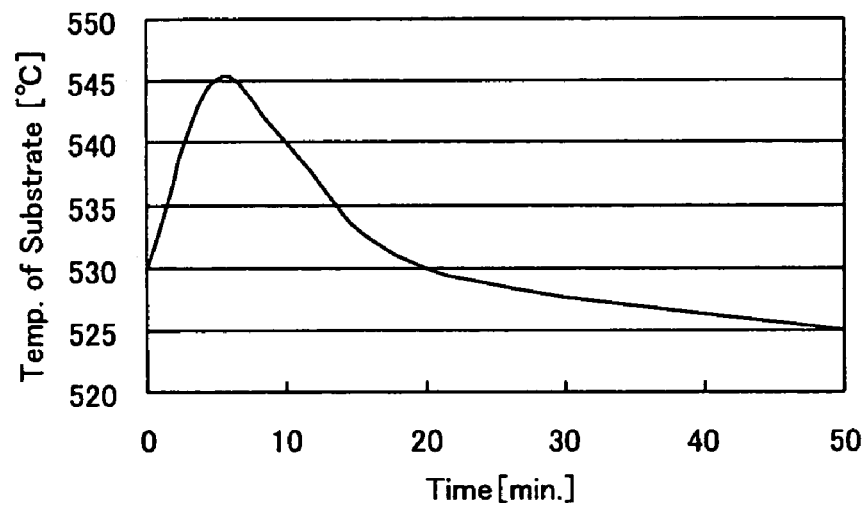
FIG. 1 is a graph for illustrating the temperature change of a substrate since a glow discharge was started in the course of forming an amorphous carbon film on a clutch plate, an example of an amorphous-carbon coated member according to an embodiment of the present invention.

Having generally described the present invention, a further understanding can be obtained by reference to the specific preferred embodiments which are provided herein for the purpose of illustration only and not intended to limit the scope of the appended claims.

An amorphous-carbon coated member according to the present invention comprises a conductive substrate, and an amorphous carbon film fixed onto a part of a surface of the substrate at least. The conductive substrate is not limited in particular as far as it is composed of a conductive material, which exhibits conductivity. The conductive substrate can be a substrate, which comprises an insulator and a conductive coating applied onto a surface of the insulator. Moreover, the shape of the conductive substrate is not limited in particular. In addition, in the present amorphous-carbon coated member, the amorphous carbon film comprises a compositionally gradient film. Especially, the compositionally gradient film has an outer side and a substrate side; and is composed of carbon as a major component, silicon whose concentration inclines continuously from the lowest to the highest in the direction away from the outer side to the substrate side, and hydrogen whose concentration inclines continuously from the highest to the lowest in the direction away from the outer side to the substrate side.

The amorphous carbon film comprises the compositionally gradient film in which the silicon concentration inclines continuously from the lowest to the highest in the direction away from the outer side to the substrate side so that it is the highest on the substrate side. Since the substrate side, which is composed of more silicon, involves the $sp^3$ bond abundantly, it exhibits a higher hardness than the outer side of the amorphous carbon film does. Accordingly, the substrate side of the amorphous carbon film is good in terms of the wear resistance, and can hold the film strength. On the contrary, since the silicon concentration is low on the outer side of the amorphous carbon film, the outer side of the amorphous carbon film exhibits a lower hardness to make a flexible film.

The amorphous carbon film can preferably comprise such a compositionally gradient film that includes silicon in an amount of from 3 to 20 atomic % when the entire amorphous carbon film is taken as 100 atomic %. When the compositionally gradient film includes silicon in an amount of 3 atomic % or more with respect to the entirety taken as 100 atomic %, it makes an amorphous carbon film which exhibits a high hardness and is good in terms of the wear resistance. Moreover, when the compositionally gradient film includes silicon in an amount of 20 atomic % or less with respect to the entirety taken as 100 atomic %, it makes an amorphous carbon film which is provided with a flexible superficial portion, without impairing the strength of amorphous carbon film.

Note that amorphous carbon including silicon shows good adhesiveness to metallic substrate when it is formed as an amorphous carbon film on a surface of the metallic substrate. That is, when the amorphous carbon film exhibits the highest silicon concentration on the substrate side, it is good in view of adhesiveness to substrate. In this instance, the amorphous carbon film can preferably comprise an inner part which extends from the substrate side to less than 1 μm away therefrom to the outer side, and which comprises silicon in a concentration of from 5 to 30 atomic % when the inner part is taken as 100 atomic %. When the silicon concentration falls in the preferable range, the amorphous carbon film exhibits more favorable adhesiveness to the conductive substrate. However, if such is the case, the thickness of the amorphous carbon film can desirably be from 1 to 20 μm.

Moreover, the amorphous carbon film can preferably comprise an outer part which extends from the outer side to less than 1 μm away therefrom to the substrate side, and which comprises silicon in a concentration of from 1 to 15 atomic % when the outer part is taken as 100 atomic %. When the silicon concentration falls in the preferable range, silicon little impairs the flexibility of the amorphous carbon film on the outer side. However, if such is the case, the thickness of the amorphous carbon film can desirably be from 1 to 20 μm.

In addition, the amorphous carbon film comprises the compositionally gradient film in which the hydrogen concentration inclines continuously from the highest to the lowest in the direction away from the outer side to the substrate side so that it is the lowest on the substrate side. That is, the amorphous carbon film comprises hydrogen in a higher concentration on the outer side. Since the outer side, which is composed of more hydrogen, involves the C—H bond, organic compound, abundantly, it is softer than the substrate side of the amorphous carbon film is. Accordingly, when the present amorphous-carbon coated member's one of the opposite surfaces, onto which the amorphous carbon film is fixed, makes a sliding surface, it is possible to inhibit the present amorphous-carbon coated member from damaging mating member (or to reduce the aggressiveness against mating member). Specifically, the amorphous carbon film can preferably exhibit a Vickers hardness of from 800 to 2,500 Hv.

The amorphous carbon film can preferably comprise such a compositionally gradient film that includes hydrogen in an amount of from 1 to 50 atomic % when the entire amorphous carbon film is taken as 100 atomic %. When the compositionally gradient film includes hydrogen in an amount of 1 atomic % or more with respect to the entirety taken as 100 atomic %, an amorphous carbon film exhibits less aggressiveness against the mating member because amorphous carbon is not impaired in its flexibility. Moreover, when the compositionally gradient film includes hydrogen in an amount of 50 atomic % or less with respect to the entirety taken as 100 atomic %, it is possible to form the amorphous carbon film favorably. Note that too much amount of hydrogen is not preferable because it is difficult to form the amorphous carbon film.

In this instance, the amorphous carbon film can preferably comprise an inner part which extends from the substrate side to less than 1 μm away therefrom to the outer side, and which comprises hydrogen in a concentration of from 0.5 to 40 atomic %, further preferably from 1 to 40 atomic % when the inner part is taken as 100 atomic %. When the hydrogen concentration falls in the preferable range, hydrogen little impairs the strength of the amorphous carbon film. Moreover, the amorphous carbon film can preferably comprise an outer part which extends from the outer side to less than 1 μm away therefrom to the substrate side, and which comprises hydrogen in a concentration of from 3 to 55 atomic %, further preferably from 3 to 50 atomic % when the outer part is taken as 100 atomic %. When the hydrogen concentration falls in the preferable range, it is possible to favorably reduce the aggressiveness of the amorphous carbon film against mating member on the outer side. However, in both cases, the thickness of the amorphous carbon film can desirably be from 1 to 20 μm.

The amorphous carbon film can preferably have a thickness of from 1 to 20 μm. The amorphous carbon film having a thickness falling in the preferable range is good in terms of mechanical durability such as wear resistance, and can function well as a protective film against corrosion.

Moreover, the present amorphous-carbon coated member exhibits insulativeness, corrosion resistance, shock resistance and wear resistance because of the characteristics possessed by amorphous carbon. Accordingly, as the specific applications of the present amorphous-carbon coated member, it is possible to name various clutches used in automatic transmission, clutch plates, one the component parts of brake, tools, jigs, molds, cutting edges, pump members, vanes, dies and punches.

The present amorphous-carbon coated member, which comprises the above-described compositionally gradient film, can be produced by forming an amorphous carbon film on a conductive substrate by means of direct plasma chemical vapor deposition (hereinafter abbreviated to as "CVD") process.

In a plasma CVD process, a glow discharge occurs by applying an electric power between two electrodes, a positive electrode and a negative electrode. A process gas, which is introduced between the electrodes, is activated by the resulting glow discharge, and a film is deposited on a negative-voltage side electrode. Specifically, the amorphous carbon film can be formed in the following manner: the conductive substrate, which is disposed in a film-forming chamber, is connected with a negative electrode, and is subjected to the glow discharge to form the amorphous carbon film thereon.

The conductive substrate is not limited in particular as far as it is composed of conductive material which exhibits conductivity. The conductive material can preferably exhibit a volume resistivity of $10^8$ Ω·cm or less. Specifically, the conductive substrate can be composed of metallic material or conductive ceramic. The metallic material can be iron, aluminum, copper, titanium and magnesium, or their alloys. Moreover, since the shape of the conductive substrate is not limited in particular, the amorphous carbon film can be formed on various members.

It is advisable that the conductive substrate can be fixed on a substrate holder, which is disposed in a film-forming chamber and is connected with a negative electrode. In this instance, it is necessary to fix the conductive substrate so that it contacts partially with the substrate holder, which is connected with the negative electrode. Note that the substrate holder is not limited in particular in view of the shape, as far as it is composed of conductive material. Accordingly, the substrate holder can be formed as various shapes which comprise a fastener capable of fixing the conductive substrate partially, in addition to flat plate shapes on which the conductive substrate can be placed. When a plurality of the conductive substrates are disposed in a film-forming chamber, it is advisable to dispose the conductive substrates so that they face to each other. If such is the case, when the width of sheath, which occurs so as to cover the surface of the conductive substrates, is controlled to be the interval between the opposite faces of the neighboring two conductive substrates or less by operating the process-gas pressure and plasma electric-power source, a stable glow discharge occurs so that the amorphous carbon film can be formed on the conductive substrates favorably. Note that the term, "sheath," herein designates a dimly light-emitting area which stretches from the surface of the negative electrode to the negative glow.

Moreover, when the conductive substrate is formed as a plate shape, a plurality of the plate-shaped conductive substrates can desirably be disposed on a substrate holder parallelly thickness-wise and in a laminated manner. When the plate-shaped conductive substances are disposed parallelly thickness-wise and in a laminated manner, it is possible to dispose a large number of the plate-shaped conductive substrates in a film-forming chamber. Accordingly, it is possible to perform film forming onto a large number of the plate-shaped conductive substrates once in a single film-forming process. Consequently, it is possible to reduce the processing cost.

In addition, a process gas for forming the amorphous carbon film can desirably comprise a raw-material gas, which includes at least one member selected from the group consisting of organometallic-compound-containing gases and halides. The organometallic-compound-containing gases and halides contain at least silicon. Alternatively, the process gas can desirably be a mixture gas, which includes the raw-material gas and a diluent gas. The diluent gas may be at least one member selected from the group consisting of hydrogen and noble gases. Moreover, the raw-material gas can further include hydrocarbon gases. Note that the type, mixing ratio or flow-volume ratio of the process gas can be selected appropriately so that the resulting amorphous carbon film has a desirable composition.

For example, the hydrocarbon gas can desirably be methane gas, ethylene gas, acetylene gas, benzene gas, and additionally the other $C_mH_n$ hydrocarbon gas. Moreover, the organometallic-compound-containing gas which includes silicon can desirably be tetramethyl silane ($Si(CH_3)_4$, hereinafter abbreviated to as "TMS" wherever appropriate) gas, or silane. In addition, the halide-containing gas which includes silicon can desirably be silicon tetrachloride gas. The diluent gas can be hydrogen gas, or argon gas.

Moreover, the amorphous carbon film, the compositionally gradient film whose composition inclines continuously as described above, can be formed by controlling the film-forming temperature at the completion of film formation lower than the film-forming temperature at the start of film formation. This advantageous film-forming mechanism is believed to result from the fact that, when the film-forming temperature is low, the amount of silicon included in amorphous carbon film diminishes because the chemical reaction of the organometallic-compound-containing gas, such as TMS gas, is suppressed; and the amount of hydrogen dissociating from amorphous carbon film under forming decreases so that the amount of hydrogen included in the resultant amorphous carbon film increases.

Therefore, when producing the present amorphous-carbon coated member, it is advisable to start the forming of the amorphous carbon film after increasing the temperature of the conductive substrate to a high temperature by glow discharge and to drop the temperature of the conductive substrate little by little in the film forming. As for a method for forming the amorphous carbon film while decreasing the temperature of the conductive substrate, it is possible to name controlling the voltage which a plasma electric-power source applies to the conductive substrate. The temperature of the conductive substrate in the film forming can preferably controlled in range of from 480 to 580° C. at the start of film forming; and can preferably controlled in range of from 460 to 560° C. at the end of film forming. Note that it is satisfactory that the temperature of the conductive substrate in the film forming can reach the preferable ranges at the outermost surface at least. Moreover, when the temperature of the conductive substrate differs between the start of film forming and the end of film forming by from 5 to 30° C., it is possible to form the amorphous carbon film, the above-described compositionally gradient film, favorably.

Note that the amorphous carbon film is an insulative film. That is, the more the thickness of the amorphous carbon film increases as the film forming develops, the less electric current is likely to flow in the amorphous carbon film. As a result, the electric power applied to the conductive substrate decreases gradually so that the temperature of the conductive substrate under film forming drops as well. Accordingly, depending on film-forming conditions, it is possible to form the amorphous carbon film, the desirable compositionally gradient film, without changing the film-forming temperature intentionally. Specifically, it is desirable to control the film-forming temperature at 450° C. or more at the start of film forming; and to control the film-forming rate to 1.4 nm/sec. or less. Thus, it is possible to appropriately drop the temperature of the conductive substrate without changing the other film-forming conditions.

Note that the present amorphous-carbon coated member is not limited to the above-described preferable embodiment modes. As far as the advantages produced by the present invention are not impaired, the present amorphous-carbon coated member can further comprise an intermediate layer, which is formed between the conductive substrate and the amorphous carbon film; or a rough surface or a nitrided layer, which is formed on a surface of the conductive substrate.

EXAMPLE

Figure 3:
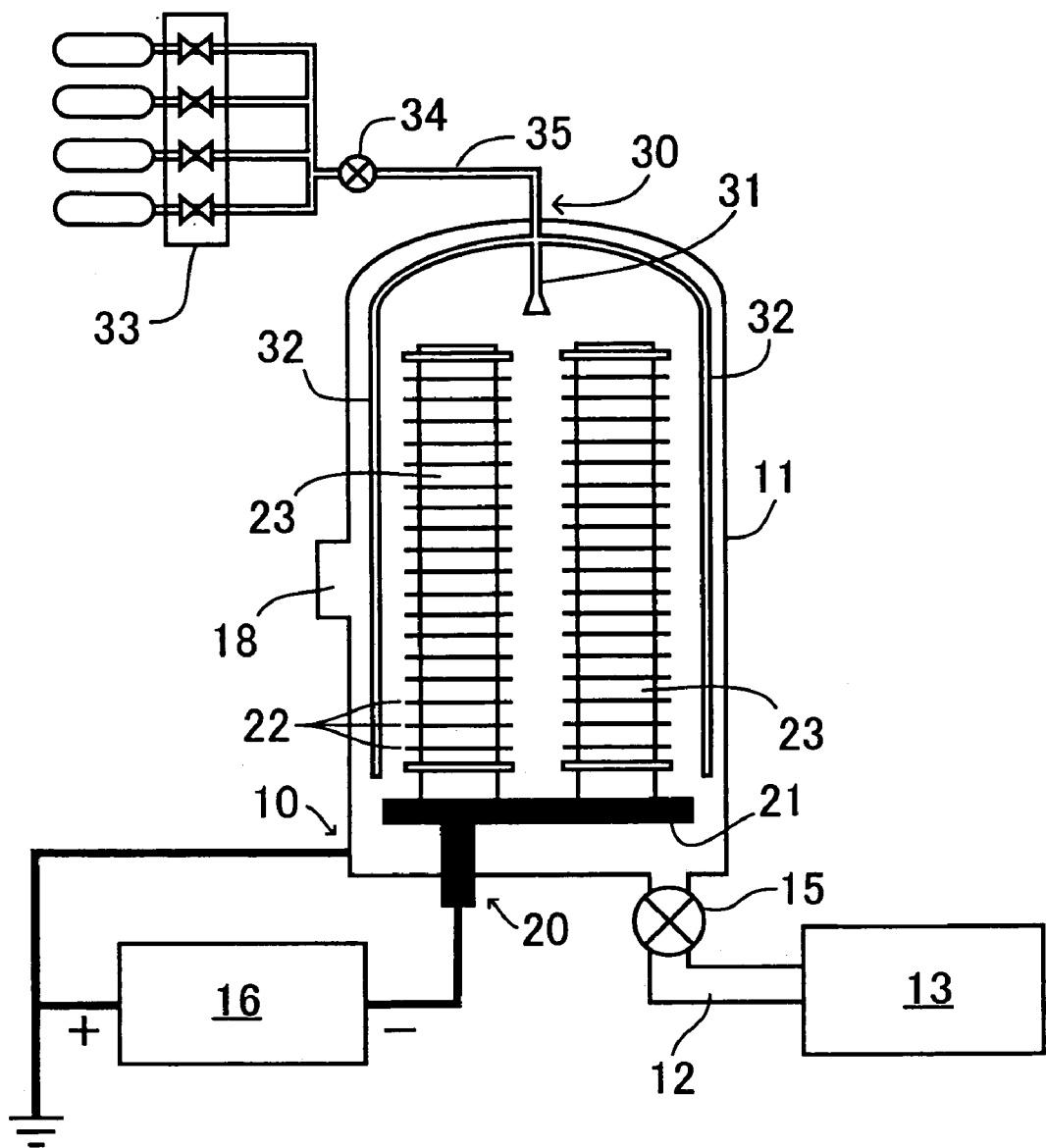
FIG. 3 is a diagram for roughly illustrating an apparatus for forming an amorphous carbon film, the apparatus which was used in an example according to the present invention.
Figure 4:
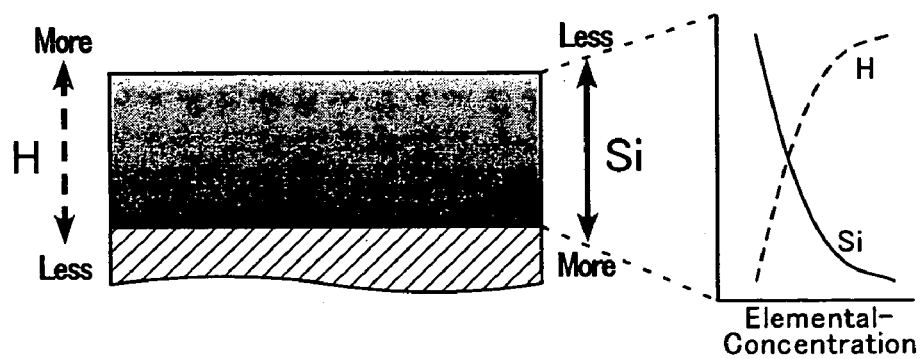
FIG. 4 is an explanatory diagram for schematically illustrating a cross-section of an amorphous-carbon coated member according to the present invention, and shows an example of the distributions of silicon and hydrogen concentrations graphically.

Hereinafter, an amorphous-carbon coated member according to an example of the present invention will be described with reference to the accompanying drawings. First of all, an apparatus for forming an amorphous carbon film will be described using FIG. 3.

Film-Forming Apparatus

A film-forming apparatus according to the present example was an apparatus for forming an amorphous carbon film on the top and bottom surfaces of substrates 22 as well as the outer peripheral surface thereof. Note that the substrates 22 were composed of carbon tool steel. As the film-forming chamber, a chamber 11 was used. The chamber 11 had a cylinder-shaped furnace chamber, and was made of stainless steel. The chamber 11 comprised an exhaust system 13, which was communicated with the chamber 11 through an exhaust passage 12. The exhaust system 13 comprised an oil rotary pump, a mechanical booster pump, and an oil diffusion pump. Moreover, an exhaust control valve 15, which was disposed in the exhaust passage 12, was opened or closed to control the process-gas pressure within the chamber 11. In addition, the chamber 11 was provided with a transparent window 18, which protruded outward from a lateral face of the chamber 11 to the outside. Thus, the superficial temperature of the substrates 22 was measured by an infrared radiation thermometer (not shown) through the transparent window 18.

In the chamber 11, there were disposed substrate fixing means 20, and gas supplying means 30. The substrate fixing means 20 was connected electrically with the negative electrode of a plasma electric-power source 16, a direct-current power source.

The substrate fixing means 20 comprised a support bench 21, and five substrate fixtures 23. The support bench 21 was connected with the negative electrode of the plasma electric-power source 16. The substrate fixtures 23 were placed on the support bench 21. The substrates 22 were fixed onto each of the substrate fixtures 23. Note that each of the substrates 22 was formed as an annular-shaped disk whose thickness was 3 mm to make a clutch plate, and was provided with internal gear teeth on the inner peripheral surface.

The plate-shaped support bench 21 was further formed as a disk shape, and was fixed on the bottom of the furnace chamber coaxially with the chamber 11. The five substrate fixtures 23 were made of carbon steel, and were placed at equal intervals on the support bench 21 in an annular manner. Thus, the substrate fixtures 23 were disposed on an imaginary ring which is coaxial with the cylinder-shaped chamber 11.

Moreover, the substrate fixtures 23 comprised a cylinder-shaped fixing column (not shown), and a plurality of jigs (not shown), respectively. The fixing column was supported on the support bench 21 so as to extend vertically. The jigs held a plurality of the substrates 22 at equal intervals parallelly and in a thickness-wise laminated manner. The internal gear teeth of the substrates 22 were held by the jigs to fix the substrates 22 onto the substrate fixtures 23. Thus, 100 pieces of the substrates 22 were fixed onto one of substrate fixtures 23. Accordingly, the substrates 22 were fixed onto the five substrate fixtures 23 in a quantity of 500 pieces in total.

The gas supplying means 30 supplied a mixture gas composed of a raw material gas and a diluent gas in a predetermined flow volume ratio. The mixture gas was supplied inside the chamber 11 through a gas supplying pipe 35 via a gas supplying valve 34 after the flow volume was controlled by a mass flow controller (hereinafter abbreviated to as "MFC") 33. The gas supplying pipe 35 was branched into a central gas nozzle 31, and six circumferential gas nozzles 32, which surrounded the central gas nozzle 31, in the chamber 11. The central gas nozzle 31 was disposed so as to be located at the center of the chamber 11. Moreover, the six circumferential gas nozzles 32 were disposed at equal intervals in an annular manner on the centrifugal sides with respect to the annularly disposed substrate fixtures 23. The central gas nozzle 31 was provided with a plurality of apertures, through which the mixture gas was spouted, at the leading end. In addition, the circumferential gas nozzles 32 were provided with a plurality of apertures, which were opened at equal intervals in the length-wise direction, and through which the mixture gas was supplied.

The positive electrode of the plasma electric-power source 16 was connected with the chamber 11 electrically. The positive electrode was grounded. Accordingly, the inner surface of the chamber 11 made the ground electrode (or positive electrode). That is, in the present example, the substrate fixing means 20 and the substrates 22, which were fixed onto the substrate fixing means 20, made a negative electrode 20, and the chamber 11 made a positive electrode 10 to carry out film forming.

Production of Amorphous-carbon Coated Member

The film-forming apparatus constructed as described above was actuated to form an amorphous carbon film on the surface of the substrates 22. First of all, the exhaust system 13 was operated to evacuate within the chamber 11 to an attainable vacuum degree of $6.7 \times 10^{-3}$ Pa. Then, the gas supplying valve 34 was opened to supply a hydrogen gas and a nitrogen gas into the chamber 11. In this instance, note that the flow volumes of the hydrogen gas and nitrogen gas were controlled to 1,000 c.c./min. and 1,000 c.c./min., respectively, with the MFC 33. Thereafter, the opening degree of the exhaust control valve 15 was controlled to increase the process-gas pressure within the chamber 11 to 500 Pa.

Subsequently, the plasma electric-power source 16 was turned on to apply a voltage of 335 V to the negative electrode 20. When the voltage is applied, a glow discharge arose around the periphery of the negative electrode 20. Note that the discharge electric power was controlled so that the applying voltage was 335 V and the flowing electric current was 30 A. The resulting glow discharge heated the substrates 22 to 530° C. Note that the temperature of the substrates 22 was measured using the aforementioned infrared radiation thermometer. When the temperature of the substrate 22 reached 530° C., the raw material gas, the mixture gas of methane, TMS and hydrogen, was supplied into the chamber 11 at a predetermined flow volume to grow an amorphous carbon film on the surface of the substrates 22. Note that the flow volume of the mixture gas was controlled so that methane, TMS, and hydrogen were supplied in a flow volume of 500 c.c./min., 100 c.c./min., and 300 c.c./min., respectively, at 25° C.

FIG. 1 is a graph for illustrating the temperature change, which the substrates 22 exhibited from the start of the glow discharge to the completion of the film forming in the film forming step for the amorphous carbon film. The temperature of the substrates 22 became 545° C. after 6 minutes since the start of the glow discharge; and the film forming was completed after 50 minutes since the flow discharge started, or when the temperature of the substrates 22 became 525° C. As shown in the drawing, the temperature of the substrates 22 dropped gently as the film forming developed. Thus, the amorphous carbon film whose thickness was 3 μm was formed on the surface of the substrates 22 by subjecting the substrates 22 to the glow discharge for 50 minutes, thereby producing a clutch plate "A."

Evaluation

Figure 2:
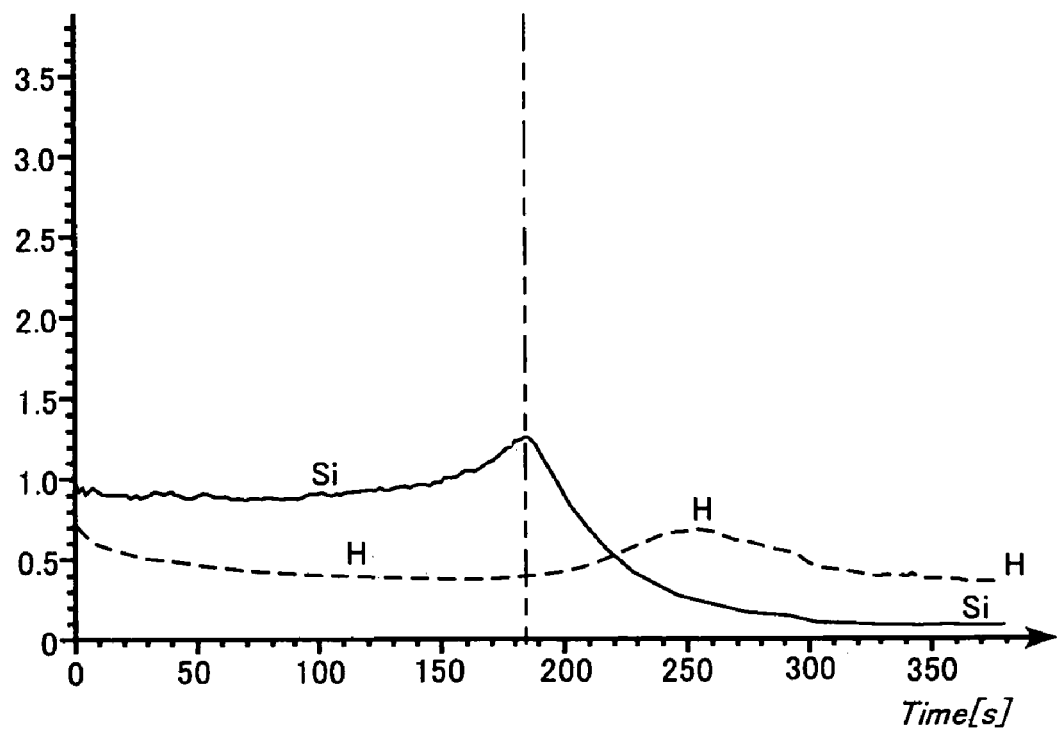
FIG. 2 is a graph for illustrating part of the result of an elemental analysis on the clutch plate in the depth-wise direction (or the thickness-wise direction of the amorphous carbon film) by means of a glow-discharge emission spectrophotometer (hereinafter abbreviated to as "GDS" wherever appropriate).

The clutch plate "A" was subjected to an elemental analysis in the depth-wise direction, that is, in the thickness-wise direction of the amorphous carbon film, using a GDS. FIG. 2 illustrates part of the analyzed results, the elemental concentrations of Si and H, only. Note that the horizontal axis of FIG. 2 specifies the analysis time, and implies the depth from the amorphous carbon film's surface. The part of from 0-second analysis time to 185-second analysis time corresponds to the amorphous carbon film, and the part of from 185-second analysis on corresponds to the substrates 22. Moreover, the vertical axis specifies the light intensity, and implies the elemental concentrations of Si and H.

As can be appreciated from FIG. 2, the amorphous carbon film of the clutch plate "A" was found to be a compositionally gradient film which was composed of Si and H whose concentrations inclined continuously in the following manner. That is, the Si concentration inclined continuously from the lowest to the highest in the direction away from the surface of the amorphous carbon film to the side of the substrates 22. The H concentration inclined continuously from the highest to the lowest in the direction away from the surface of the amorphous carbon film to the side of the substrates 22.

According to the analyzed results by the GDS, the following were found out. The amorphous carbon film of the present example comprised 11-atomic-% Si and 40-atomic-% H when the entire amorphous carbon film was taken as 100 atomic %. Moreover, the amorphous carbon film comprised an inner part which extended by 0.9 μm from the substrate surface to the outside, and which included Si and H in a concentration of 13 atomic % and 30 atomic %, respectively, when the inner part was taken as 100 atomic %. In addition, the amorphous carbon film comprised an outer part which extended by 0.9 μm from the film surface to the inside, and which included Si and H in a concentration of 10 atomic % and 50 atomic %, respectively, when the outer part was taken as 100 atomic %.

Moreover, the μ-v characteristic of the clutch plate "A" was evaluated. The μ-v characteristic specifies the dependency of friction coefficient μ on the revolving speed v of clutch plate. It is said to be effective that the μ-v characteristic shows a positive gradient, that is, $d\mu/dv \geqq 0$. In the evaluation, a clutch plate "B," which was prepared as described below, was used as a mating member. 0.7-MPa pressure was exerted between the clutch plate "A" and the clutch Plate "B" at 50° C. in the presence of a lubricant. Then, the clutch plate "A" was engaged with the clutch plate "B" at a relative revolving speed of 2 rpm, 50 rpm, 100 rpm, 150 rpm, 200 rpm and 250 rpm to calculate 50 (friction coefficient at 50-rpm revolving speed)/$\mu_2$ (friction coefficient at 2-rpm revolving speed) (note that the notation is being the same hereinafter), $\mu_{100}/\mu_{50}$, $\mu_{150}/\mu_{100}$, $\mu_{200}/\mu_{150}$ and $\mu_{250}/\mu_{200}$.

Note that the clutch plate "B" comprised the same substrate as used in the above-described example, and a nitrided layer. The nitrided layer was formed on the surface of the substrate by carrying out a nitriding treatment, and made a sliding surface. Moreover, a comparative clutch plate "B," which was subjected to a lapping treatment, was prepared, and was examined for the μ-v characteristic between the comparative clutch plates "B" (hereinafter abbreviated to as B/B) in order to compare it with the μ-v characteristic between the clutch plate "A" and the clutch plate "B" (hereinafter abbreviated to as A/B). Table 1 below sets forth the results. Note that the results are expressed in the average values of nine examinations in total.

TABLE 1

| | Initial μ-v Characteristic ($\mu_x/\mu_y$) | | | | |
|---|---|---|---|---|---|
| | $\mu_{50}/\mu_2$ | $\mu_{100}/\mu_{50}$ | $\mu_{150}/\mu_{100}$ | $\mu_{200}/\mu_{150}$ | $\mu_{250}/\mu_{200}$ |
| A/B | 1.104 | 1.026 | 1.019 | 1.013 | 1.004 |
| B/B | 1.100 | 1.017 | 1.015 | 1.007 | 0.993 |

From Table 1, it is apparent that the A/B, the initial μ-v characteristic ($\mu_x/\mu_y$) which was exhibited between the clutch plate "A" according to the example and the clutch plate "B," was 1 or more (that is, the initial μ-v characteristic showed a positive gradient) in all sets of revolving speeds. Thus, the clutch plate "A" showed better initial μ-v characteristic ($\mu_x/\mu_y$) than the B/B, the initial μ-v characteristic ($\mu_x/\mu_y$) exhibited between the comparative clutch plates "B," which were subjected to a lapping treatment. That is, the clutch plate "A" showed low aggressiveness against the mating member. Accordingly, the clutch plate "A" wore off the clutch plate "B," the mating member, less in service, though not being subjected to a lapping treatment. Consequently, not only the clutch plate "A" was produced at low cost, but also it dispersed the oil film between the clutch plate "A" and the clutch plate "B" favorably to produce solid-state contact between them properly. As a result, the clutch plate "A" demonstrated the good μ-v characteristic.

Having now fully described the present invention, it will be apparent to one of ordinary skill in the art that many changes and modifications can be made thereto without departing from the spirit or scope of the present invention as set forth herein including the appended claims.

What is claimed is:

1. An amorphous-carbon coated member, comprising:
   a conductive substrate; and
   an amorphous carbon film fixed onto a part of a surface of the substrate at least, the amorphous carbon film comprising a compositionally gradient film;

the compositionally gradient film having an outer side and a substrate side, and composed of carbon as a major component, silicon whose concentration inclines continuously from the lowest to the highest in the direction away from the outer side to the substrate side, and hydrogen whose concentration inclines continuously from the highest to the lowest in the direction away from the outer side to the substrate side.

2. The amorphous-carbon coated member set forth in claim 1, wherein the amorphous carbon film comprises silicon in an amount of from 3 to 20 atomic % when the entire amorphous carbon film is taken as 100 atomic %.

3. The amorphous-carbon coated member set forth in claim 1, wherein the amorphous carbon film comprises hydrogen in an amount of from 1 to 50 atomic % when the entire amorphous carbon film is taken as 100 atomic %.

4. The amorphous-carbon coated member set forth in claim 1, wherein the amorphous carbon film has a thickness of from 1 to 20 μm.

5. The amorphous-carbon coated member set forth in claim 1, wherein the amorphous carbon film comprises an inner part which extends from the substrate side to less than 1 μm away therefrom to the outer side, and which comprises silicon in a concentration of from 5 to 30 atomic % when the inner part is taken as 100 atomic %.

6. The amorphous-carbon coated member set forth in claim 1, wherein the amorphous carbon film comprises an outer part which extends from the outer side to less than 1 μm away therefrom to the substrate side, and which comprises silicon in a concentration of from 1 to 15 atomic % when the outer part is taken as 100 atomic %.

7. The amorphous-carbon coated member set forth in claim 1, wherein the amorphous carbon film comprises an inner part which extends from the substrate side to less than 1 μm away therefrom to the outer side, and which comprises hydrogen in a concentration of from 0.5 to 40 atomic % when the inner part is taken as 100 atomic %.

8. The amorphous-carbon coated member set forth in claim 1, wherein the amorphous carbon film comprises an inner part which extends from the substrate side to less than 1 μm away therefrom to the outer side, and which comprises hydrogen in a concentration of from 1 to 40 atomic % when the inner part is taken as 100 atomic %.

9. The amorphous-carbon coated member set forth in claim 1, wherein the amorphous carbon film comprises an outer part which extends from the outer side to less than 1 μm away therefrom to the substrate side, and which comprises hydrogen in a concentration of from 3 to 55 atomic % when the outer part is taken as 100 atomic %.

10. The amorphous-carbon coated member set forth in claim 1, wherein the amorphous carbon film comprises an outer part which extends from the outer side to less than 1 μm away therefrom to the substrate side, and which comprises hydrogen in a concentration of from 3 to 50 atomic % when the outer part is taken as 100 atomic %.

11. The amorphous-carbon coated member set forth in claim 1, wherein the amorphous carbon film comprises a deposition film which is formed by means of direct-current plasma chemical vapor deposition process while decreasing the temperature of the substrate.

* * * * *